(12) United States Patent
Shrivastava et al.

(10) Patent No.: US 11,632,107 B1
(45) Date of Patent: *Apr. 18, 2023

(54) GATE RESISTIVE LADDER BYPASS FOR RF FET SWITCH STACK

(71) Applicant: pSemi Corporation, San Diego, CA (US)

(72) Inventors: Ravindranath D. Shrivastava, San Diego, CA (US); Alper Genc, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/492,180

(22) Filed: Oct. 1, 2021

(51) Int. Cl.
| | |
|---|---|
| *H03K 17/16* | (2006.01) |
| *H03K 17/041* | (2006.01) |
| *H03K 17/0412* | (2006.01) |
| *H03K 17/693* | (2006.01) |
| *H04B 1/44* | (2006.01) |
| *H03K 17/687* | (2006.01) |
| *H03K 17/06* | (2006.01) |
| *H01L 27/06* | (2006.01) |

(52) U.S. Cl.
CPC ......... *H03K 17/687* (2013.01); *H03K 17/063* (2013.01); *H01L 27/0629* (2013.01)

(58) Field of Classification Search
None
See application file for complete search history.

(56) References Cited

U.S. PATENT DOCUMENTS

| | | | |
|---|---|---|---|
| 5,274,276 A | 12/1993 | Casper et al. | |
| 7,910,993 B2 | 3/2011 | Brindle et al. | |
| 9,143,124 B2 | 9/2015 | Cam et al. | |
| 9,184,731 B2 | 11/2015 | Lam | |
| 9,893,722 B2 | 2/2018 | Mokalla | |
| 9,941,347 B2 * | 4/2018 | Shapiro | H01L 27/027 |
| 10,236,872 B1 | 3/2019 | Willard et al. | |
| 10,396,772 B2 | 8/2019 | Shanjani et al. | |
| 10,454,529 B2 * | 10/2019 | Kerr | H04B 3/548 |
| 10,461,729 B2 | 10/2019 | Kerr et al. | |
| 10,608,623 B2 * | 3/2020 | Kerr | H04B 1/44 |

(Continued)

FOREIGN PATENT DOCUMENTS

| | | |
|---|---|---|
| EP | 3484049 A1 | 5/2019 |
| KR | 100970374 B1 | 7/2010 |

(Continued)

OTHER PUBLICATIONS

Non-Final Office Action for U.S. Appl. No. 17/321,363, filed May 14, 2021, dated Sep. 15, 2021, 14 pages.

(Continued)

*Primary Examiner* — Kenneth B Wells
(74) *Attorney, Agent, or Firm* — Steinfl + Bruno LLP

(57) ABSTRACT

A FET switch stack has a stacked arrangement of FET switches, a gate resistor network with ladder resistors and common gate resistors, and a gate resistor bypass arrangement. The bypass arrangement has a first set of bypass switches connected across the gate resistors and a second set of bypass switches connected across the ladder resistors. Bypass occurs during at least a portion of the transition state of the stacked arrangement of FET switches.

16 Claims, 9 Drawing Sheets

(56) References Cited

U.S. PATENT DOCUMENTS

| | | |
|---|---|---|
| 10,763,842 B1 | 9/2020 | Dai |
| 10,886,911 B2 | 1/2021 | Willard et al. |
| 10,897,246 B2 * | 1/2021 | Scott ............... H03K 17/04123 |
| 11,290,001 B2 | 3/2022 | Zhang et al. |
| 11,405,031 B1 | 8/2022 | Shrivastava et al. |
| 11,405,034 B1 | 8/2022 | Shapiro et al. |
| 11,405,035 B1 | 8/2022 | Genc et al. |
| 2010/0013541 A1 | 1/2010 | Balboni |
| 2010/0176783 A1 | 7/2010 | Tagome |
| 2013/0033307 A1 | 2/2013 | Lin |
| 2016/0329891 A1 | 11/2016 | Bakalski et al. |
| 2017/0302259 A1 | 10/2017 | Mokalla |
| 2019/0305768 A1 | 10/2019 | Willard et al. |
| 2020/0244226 A1 | 7/2020 | Klaren et al. |
| 2020/0266778 A1 | 8/2020 | Ayranci et al. |
| 2021/0075420 A1 | 3/2021 | Kovac et al. |

FOREIGN PATENT DOCUMENTS

| | | |
|---|---|---|
| KR | 20160131926 A | 11/2016 |
| WO | 2013/017696 A1 | 2/2013 |

OTHER PUBLICATIONS

Final Office Action for U.S. Appl. No. 17/321,363, filed May 14, 2021 on behalf of Psemi Corporation dated Mar. 15, 2022 15 pages.
International Search Report and Written Opinion for PCT/US2022/029042 filed on May 12, 2022 on behalf of Psemi Corporation dated Sep. 6, 2022 11 pages.
ISR & Written Opinion issued by the EPO for PCT/US2022/034581 dated Oct. 11, 2022, 17 pages.
Non-Final Office Action for U.S. Appl. No. 17/374,927, filed Jul. 13, 2021 on behalf of Psemi Corporation dated Apr. 14, 2022 9 pages.
Notice of Allowance for U.S. Appl. No. 17/321,363, filed May 14, 2021, on behalf of pSemi Corporation, dated Apr. 28, 2022. 8 Pages.
Notice of Allowance for U.S. Appl. No. 17/403,758, filed Aug. 16, 2021, on behalf of pSemi Corporation, dated May 25, 2022. 9 Pages.
Notice of Allowance U.S. Appl. No. 17/374,927, filed Jul. 13, 2021, on behalf of Psemi Corporation, dated May 11, 2022. 8 Pages.
ISR & Written Opinion issued by the EPO for PCT/US2022/034580 dated Oct. 11, 2022, 11 pages.
International Search Report and Written Opinion for International application No. PCT/US2022/077067 filed on Sep. 27, 2022. dated Jan. 26, 2023. 9 pages.

* cited by examiner

GATE RESISTIVE LADDER BYPASS FOR RF FET SWITCH STACK

CROSS-REFERENCE TO RELATED APPLICATIONS

The present application may be related to U.S. patent application Ser. No. 17/374,927 for a "Gate Resistor Bypass For RF FET Switch Stack" and U.S. patent application Ser. No. 17/403,758 for a "Gate Resistor Bypass For RF FET Switch Stack", both co-owned by Applicant, filed on Jul. 13, 2021 and on Aug. 16, 2021 respectively, both of which are incorporated herein by reference in their entirety.

FIELD

The present disclosure relates to integrated circuit devices, and more particularly to methods and apparatus for reducing the switching time by bypassing the gate resistive ladder of RF FET switching devices.

BACKGROUND

FIG. 1 shows a schematic representation of an RF switch FET stack (110) with input RFIN and output RFOUT. FET stack (110) is biased through resistor networks, such as body, drain/source and gate rail/rung resistor ladders, of which only gate resistor ladder (120) is shown in the figure, for ease of reference. FET stack (110) also includes a gate control block (130) to control the bias on the gate terminals of the FETs of the FET stack. Gate control block (130) includes one or more transition-dependent gate bias feed bypass resistors (also called dynamic resistors), as described, for example, in U.S. Pat. No. 10,396,772, incorporated herein by reference in its entirety.

Large values of rail resistors (vertical resistors of ladder (120)) and rung resistors (horizontal resistors of ladder (120)) cause a large internal gate settling time during a transition of the input signal IN from a first, high, static state (called VDD, +V or V+ throughout the present disclosure, e.g. +4V) to a second, low, static state (called VSS, –V or V– throughout the present disclosure, e.g. –3.4V) and vice versa. In some cases, the charging time can be as large as 4 microseconds depending on the size of the switches and the values of the rail and rung resistors.

SUMMARY

The present application describes a novel apparatus and method for reducing the switching time by bypassing the gate resistive ladder of RF FET switching devices, as described in detail in the following figures.

According to a first aspect, a FET switch stack is provided, comprising: a stacked arrangement of FET switches connected at one end to an RF terminal configured to be coupled to an RF signal, the FET switch stack configured to have an ON steady state where the FET switches are ON, an OFF steady state where the FET switches are OFF, and a transition state where the FET switches are transitioning from ON to OFF or vice versa; a gate resistor network comprising one or more ladder resistors connected to gate terminals of the FET switches; one or more common gate resistors connected to the gate resistor network, the gate resistor network and the one or more common gate resistors configured to feed a gate control voltage to the gate terminals of the FET switches; and a gate resistor bypass arrangement comprising a first set of bypass switches connected across corresponding common gate resistors and a second set of bypass switches connected across corresponding ladder resistors.

According to a second aspect, a method to reduce internal gate settling time of a FET switch stack is provided, comprising: a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa; a gate resistor network comprising ladder resistors connected to gate terminals of the FET switches; one or more common gate resistors connected to the gate resistor network, the gate resistor network and the one or more common gate resistors configured to feed a gate control voltage to the gate terminals of the FET switches; and a gate resistor bypass arrangement comprising a first set of bypass switches connected across the one or more common gate resistors and a second set of bypass switches connected across the ladder resistors, the method comprising: bypassing the one or more common gate resistors and the ladder resistors during at least a transition portion of the transition state of the stacked arrangement of FET switches; and not bypassing the one or more common gate resistors and the ladder resistors during at least a steady state portion of the ON steady state and the OFF steady state of the stacked arrangement of FET switches.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
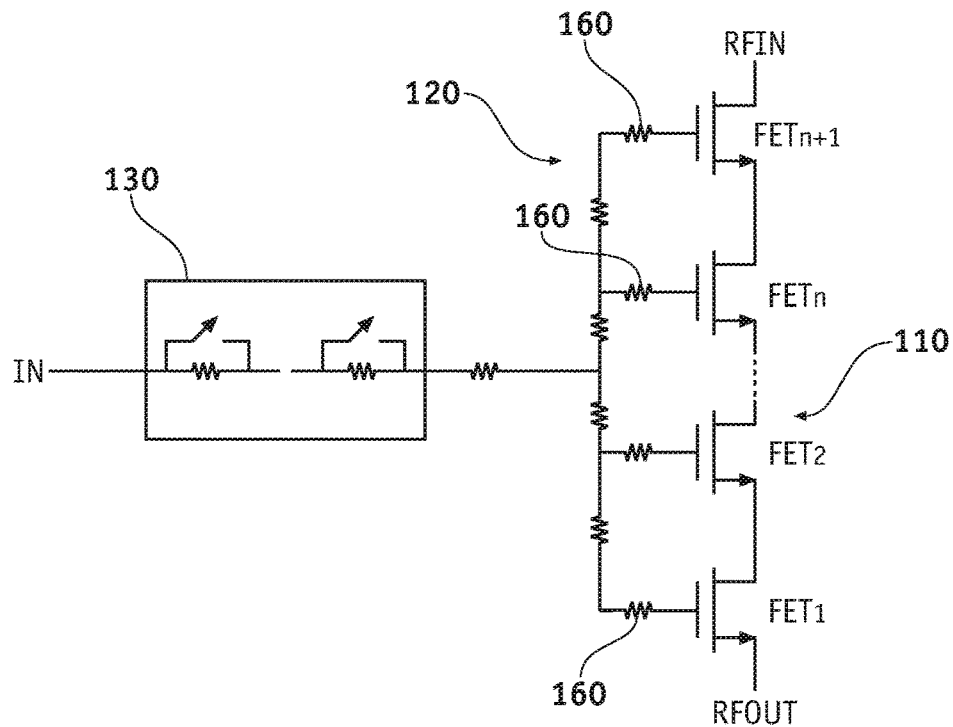
FIG. 1 shows a prior art FET switch with a gate resistor bypass.

The present disclosure describes methods and devices for bypassing the rail and/or rung resistors of the gate resistor ladder (see, e.g., gate resistor ladder (120) of FIG. 1) in combination with bypassing the gate bias feed resistors (see, e.g., gate control block (130) of FIG. 1). The rail and/or rung resistors may be referred to as ladder resistors. Each rung resistor (160) of the gate resistor ladder (120) is connected to the gate of a corresponding FET switch (e.g., FETn, FETn+1, etc.). The FET switches are arranged to form a FET stack (110).

Figure 2:
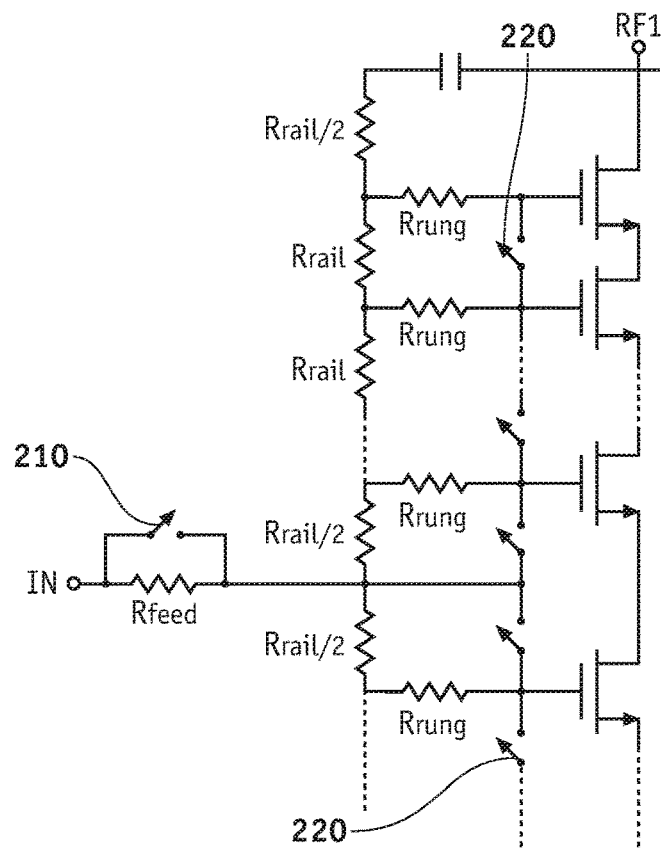
FIG. 2 shows switches configured to bypass both the common feed resistor and the rail and rung resistors of the gate resistive ladder according to an embodiment of the disclosure.

FIG. 2 shows an embodiment of the present disclosure, where switch or switches (210) configured to bypass the common feed resistor Rfeed during at least a portion (also referred to as transition portion throughout the present disclosure) of the transition of the input signal Vgate are shown in conjunction with switches (220) configured to bypass, at the same time, the rail and rung resistors Rrail and Rrung. In particular, when the switches (210) and (220) are ON (closed), the input signal IN will reach the gates of the constituent FETs of the main RF stack without going through (i.e. bypassing) the common feed resistor Rfeed and the rail and rung resistors Rrail and Rrung.

The bypass circuitry of FIG. 2 may advantageously speed up the internal gate settling for an RF switch during a transition of the input signal IN from V+ to V- or vice versa. Additionally, given that the rail and rung resistors are completely bypassed during at least a portion of the transition state of the input signal IN, the values of such resistors can be increased, thus eliminating the need for a large Rfeed resistor.

Figure 3:
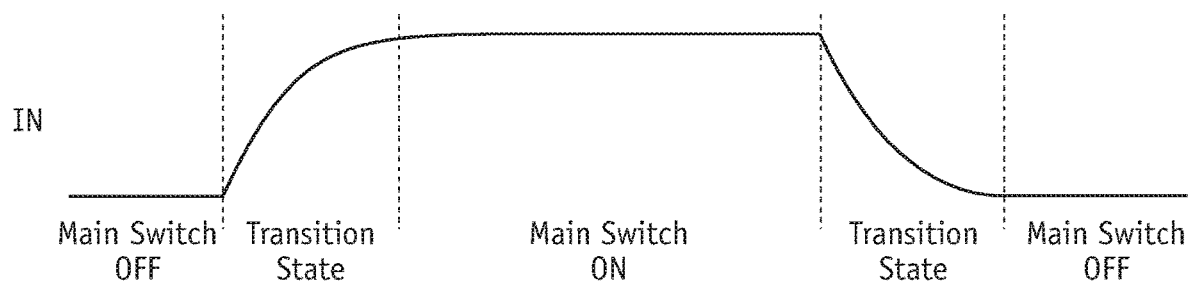
FIG. 3 shows a timing diagram of the input signal, with steady states and transition states.

FIG. 3 shows a timing diagram depicting both steady states (main switch ON or OFF) and transition states of the input signal IN. In the transition states the input signal IN transitions from OFF to ON and vice versa.

Turning now to the description of FIG. 2, as noted above, the common gate resistor switches (210) and gate ladder resistor switches (220) are configured to be ON (closed) during at least a portion of the transition state of the input signal IN. For example, assuming a 1 microsecond duration of the transition state from V+ to V- or vice versa, switches (210) and (220) can be ON for, e.g., an amount of time ranging from 800 ns to 1000 ns. Other time intervals and durations can be devised, depending on the applications of the RF switch. On the other hand, switches (210) and (220) will be OFF (open) during the remaining part of the transition and during the steady high and low states of the input signal IN.

While FIG. 2 shows an embodiment where both the rail and rung resistors are bypassed, embodiments are also possible where only the rail resistors are bypassed by the switches (220). For example, locating the switches (220) on the left of the rail resistors, each switch (220) in parallel with a corresponding rail resistor, will allow bypassing of the rail resistors only.

Figure 4:
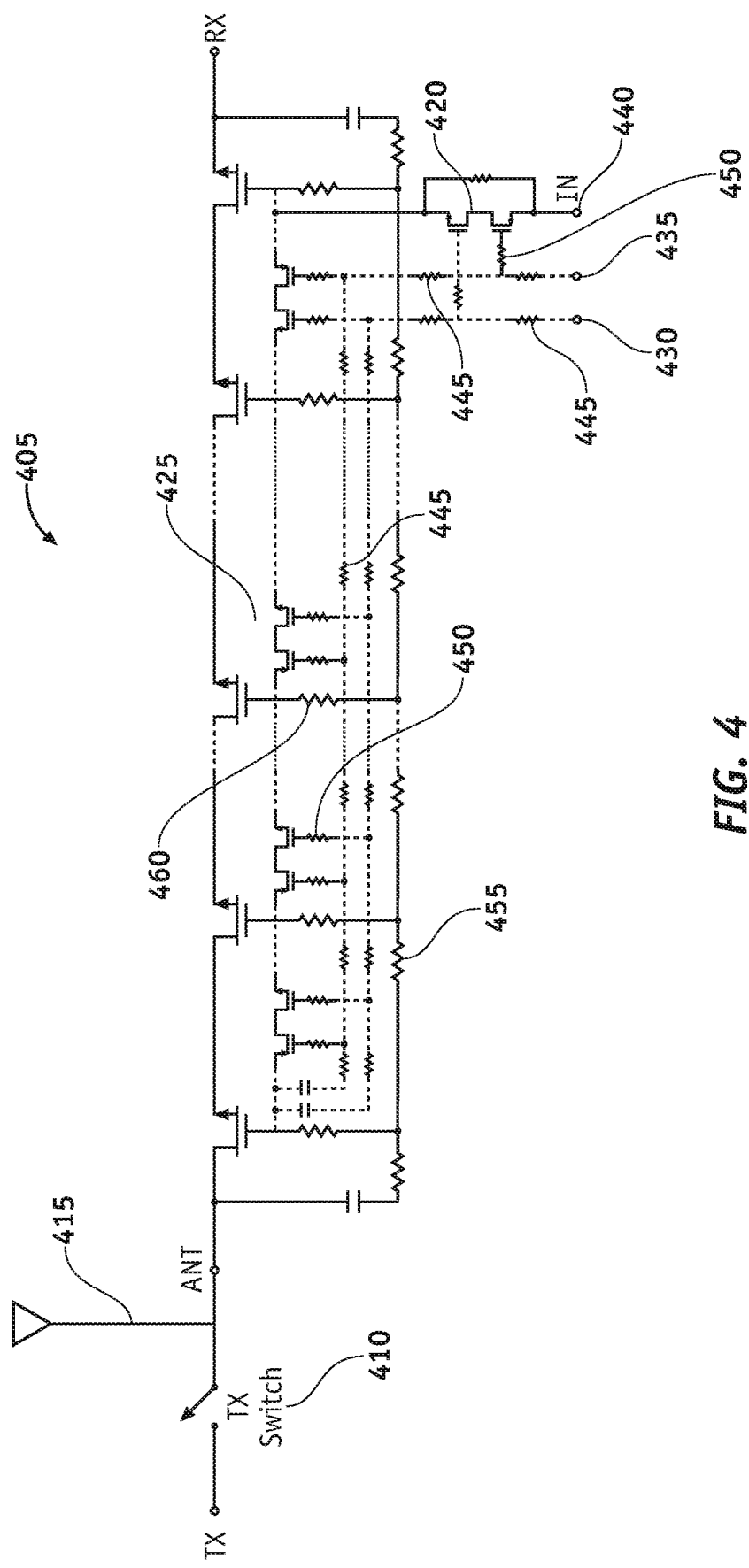
FIG. 4 shows an embodiment of the disclosure where the teachings of FIG. 2 are applied to an RX switch.

FIG. 4 shows a further embodiment of the present disclosure, where the above teachings are applied to a receiver (RX) switch (405) included in an RF circuit together with a transmitter (TX) switch (410) and an antenna (415). The RX switch (405) is configured as a stack of FETs similarly to the previous depiction of FIG. 2. Shown in FIG. 4 are common gate resistor switches (420) and gate ladder resistor switches (425), in a configuration that is similar to the one already shown in FIG. 2. In the embodiment of FIG. 4, each such switch is represented as an nMOS/pMOS transistor pair, configured to be ON during at least a portion of the transition state of the input signal IN, when both the nMOS and the pMOS are ON, and configured to be OFF otherwise. In particular, the switch is OFF when one of the nMOS/pMOS transistors is OFF and the other one is ON, thus reducing an overall stress on the nMOS and pMOS transistors during the transition. The ON and OFF status of the nMOS and pMOS transistors is controlled by control signals (430, 435) applied to the gates of each pMOS and nMOS respectively, and by the input signal (IN, 440) itself. Each control signal is applied to the gates of the nMOS/pMOS switches through its own resistive network, inclusive of common resistors (445) and gate resistors (450).

A more detailed description of bypass switches made of nMOS/pMOS pairs can be found, for example, in the disclosure of the above mentioned U.S. patent application Ser. No. 17/374,927 and U.S. patent application Ser. No. 17/403,758, both of which are incorporated herein by reference in their entirety.

Similarly to the previously described embodiment of FIG. 2, the common gate resistor switches (420) and gate ladder resistor switches (425) of FIG. 4 switch to their ON state at the same time (under control of signals (430, 435)) during a portion or the entire duration of the transition state of the input signal (IN, 440). Shown in FIG. 4 is an embodiment where both the rail (455) and rung (460) resistors are bypassed.

The gate ladder resistor switches (425) advantageously speed up the internal gate settling for the RX switch (405) during a transition of the input signal (IN, 440). Additionally, given that the rail and rung resistors are completely bypassed during at least a portion of the transition state of the input signal IN, the values of such resistors can be increased, thus eliminating the need for a large value of the common gate resistor(s) across the common gate resistor switches (420).

According to a further embodiment of the present disclosure, while the number of gate ladder resistor switches (220 in FIG. 2, 425 in FIG. 4)—also called stack height of gate ladder resistor switches throughout the disclosure—is in a relationship with the RF stack length, i.e. the number of constituent FETs of the main RF switch stack (usually number of FETs minus one), the number of common gate resistor switches (210 in FIG. 2, 420 in FIG. 4)—also called stack height of common gate resistor switches—changes according to the applications of the main RF switch stack. In particular, a larger stack height of common gate resistor switches is required in case the main RF switch needs to handle high power during its ON state.

For example, starting with the embodiment of FIG. 4, when the RX switch (405) is OFF it needs to handle high power, given the presence of an RF signal transmitted through TX switch (410). However, given the nature of the switch, the voltage at the right node of the circuit (405) during the OFF state of the switch is AC ground (0 V). On the other hand, when the RX switch (405) is ON it does not handle high power in view of its function of just being a receiver node. As a consequence, a stack height of two or even one common gate resistor switches will be enough, the stack height being controlled by the ON status of the RX switch.

Figure 5:
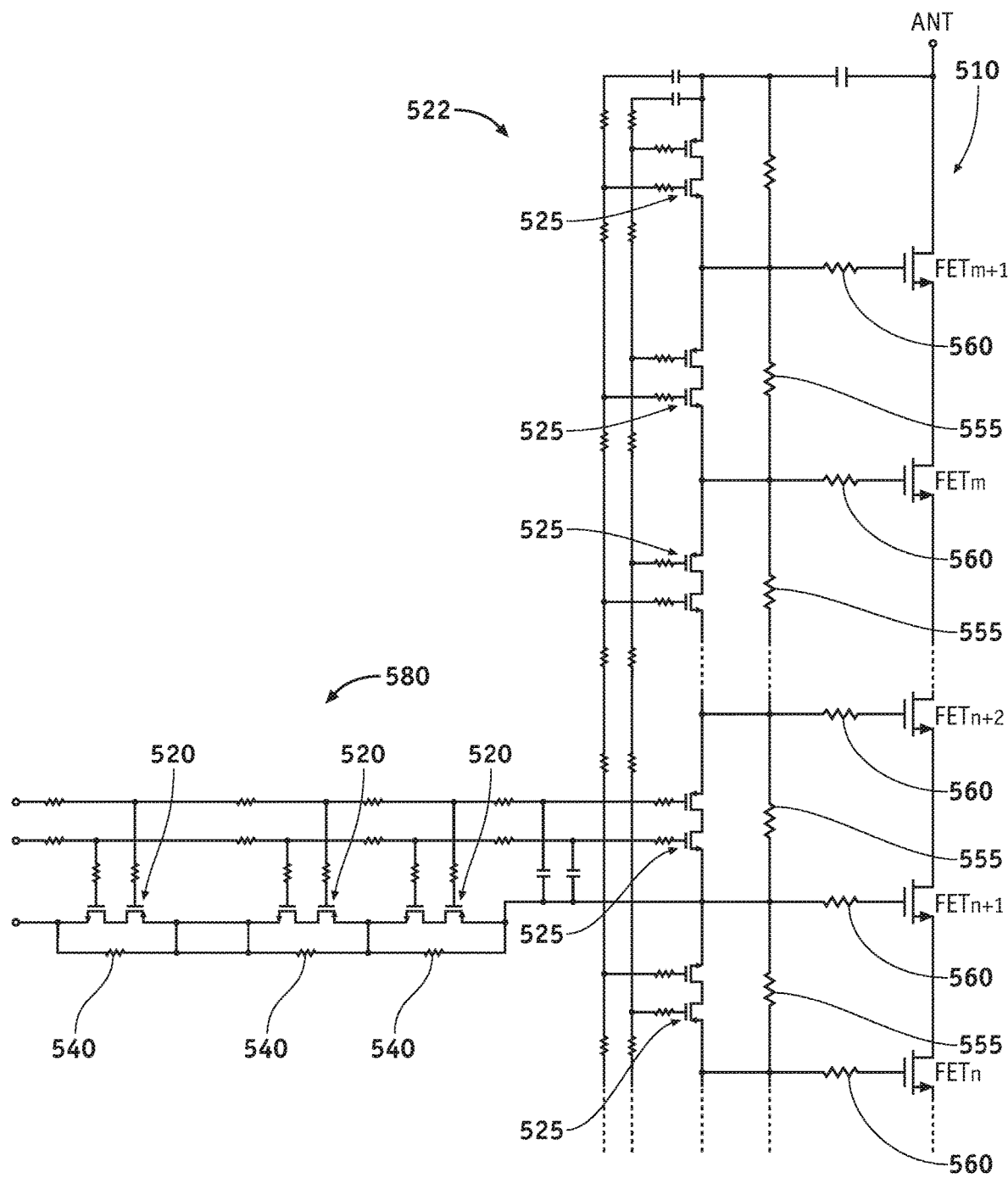
FIG. 5 shows an embodiment of the disclosure where only rail resistors of the gate network are bypassed.

FIG. 5 shows a further embodiment of the present disclosure, where only the rail resistors (555) of the gate resistor network (522) are bypassed, as seen by the fact that the ladder resistor bypass switches (525) are placed on the left of rung resistors (560). A common resistor bypass network (580) including a set of common resistor bypass switches (520) is shown in FIG. 5. In the embodiment of FIG. 5, each common resistor bypass switch (520) is connected across a corresponding common resistor (540).

In the embodiment of FIG. 5 the common resistor bypass network (580) is at the center of the FET switch stack (510). When the device is ON, the resistor bypass network (580) will see a voltage close to Vpeak (slightly lower due to voltage drops across the rail/rung network of the main RF switch). As a consequence, the ON state of the switch will control the stack height of the resistor bypass network (580), as such network should be designed to handle Vpeak. However, it should be noted that if the application of the switch is such that Vpeak in the ON state of the switch is much smaller than the maximum voltage seen by the centrally located resistor bypass network (580) at the center node of the stack during the OFF state of the main switch, then the OFF state of the main switch will control the stack height of the resistor bypass network (580).

The FET switch stack (510) comprises a stacked arrangement of FET switches (FETn, FETn+1, etc.) connected to one or more RF terminals. More in general, the teachings of the present disclosure apply to both series switches (where the main RF switch is located between a first RF+ terminal and a second RF− terminal) and shunt switches (where the main RF switch is located between an RF terminal and a reference voltage such as ground). A shunt switch usually has to handle high voltage in the OFF state. On the other hand, a series switch will need to handle high voltage in both ON and OFF states.

While bypassing the rail resistors only is possible, as shown in FIG. 5, bypassing both rail and rung resistors is a preferred approach because it will bring a faster settlement time. In this respect, it should be noted that the switches used in the bypass network have a small influence on the main RF switches (e.g. Coff of 10-15 femtofarads when compared to a Coff of 1-2 picofarads of the main RF switches). On the other hand, given that gate resistive ladders can have several configurations (e.g. rail resistors only or rung resistors only), the teachings of the present disclosure are well applicable to such cases as well.

Embodiments are also possible where the switches used for the common gate resistor bypass are different from the switches used for the gate resistor ladder. By way of example, while nMOS/pMOS pairs can be used for the switches of the gate resistor ladder, common gate resistor bypass switches like the ones disclosed in U.S. Pat. No. 10,396,772, incorporated herein by reference in its entirety, can be adopted.

Figure 6:
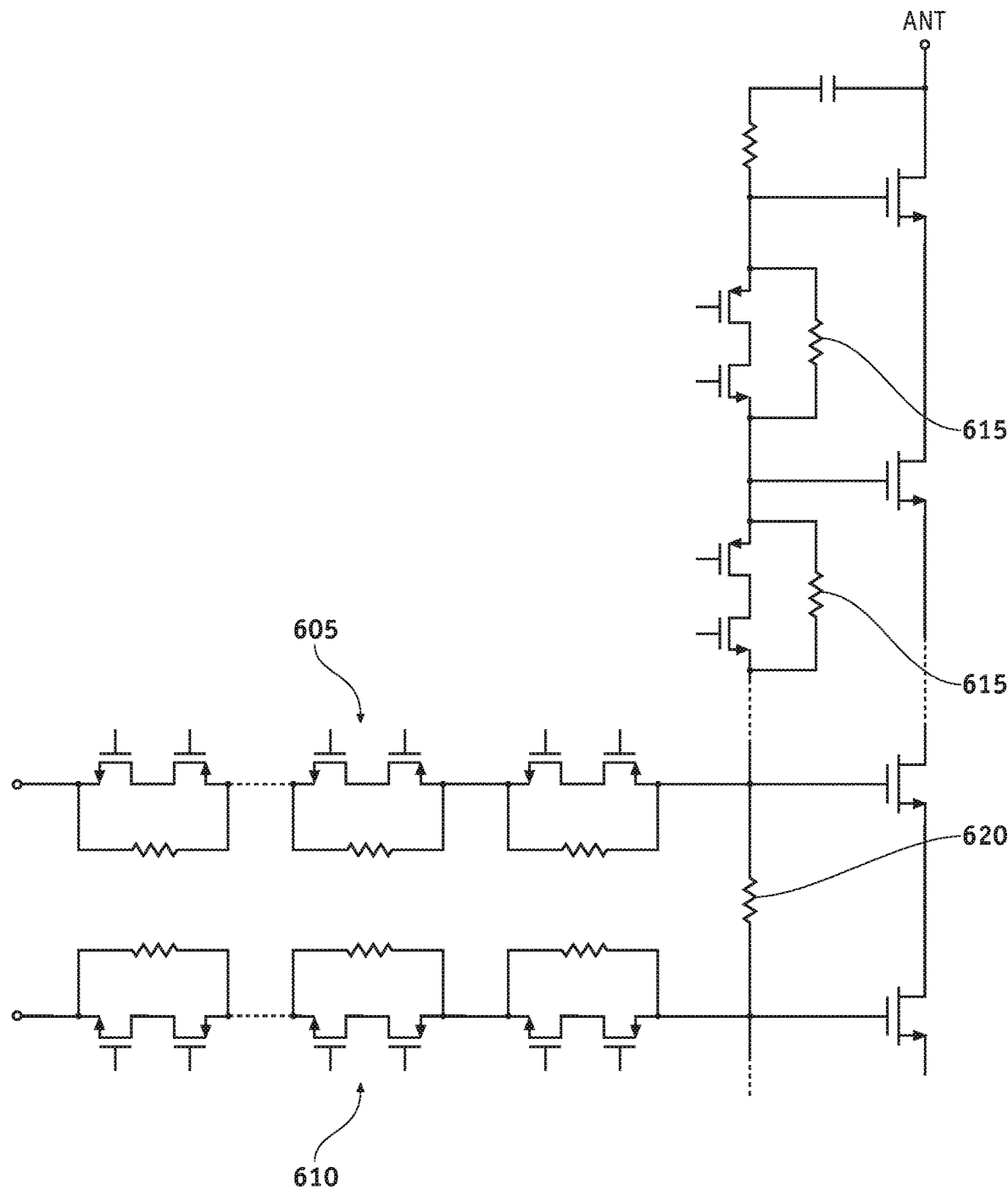
FIGS. 6 and 7 show embodiments of the disclosure where two separate feeds are provided, each bypassing a separate set of resistors in the ladder.

While the embodiments of FIGS. 4 and 5 show a single common gate resistors bypass feed, FIG. 6 shows a further embodiment of the present disclosure, where two separate feeds (605, 610) are provided, each bypassing a separate subset of rail resistors in a gate resistor ladder having rail resistors only, where only the top set of bypassed rail resistors (615) is shown in the figure, for clarity. The embodiment of FIG. 6 allows bypassing of only a select subset of rail resistors, without bypassing other resistors of the gate resistor ladder, such as resistor (620). Bifurcation into two stages has the advantage of reducing the switching time during the bypass state, given that a lower number of switches is involved for each stage. This embodiment allows handling of high voltages in both ON and OFF states of the main RF switch.

Figure 7:
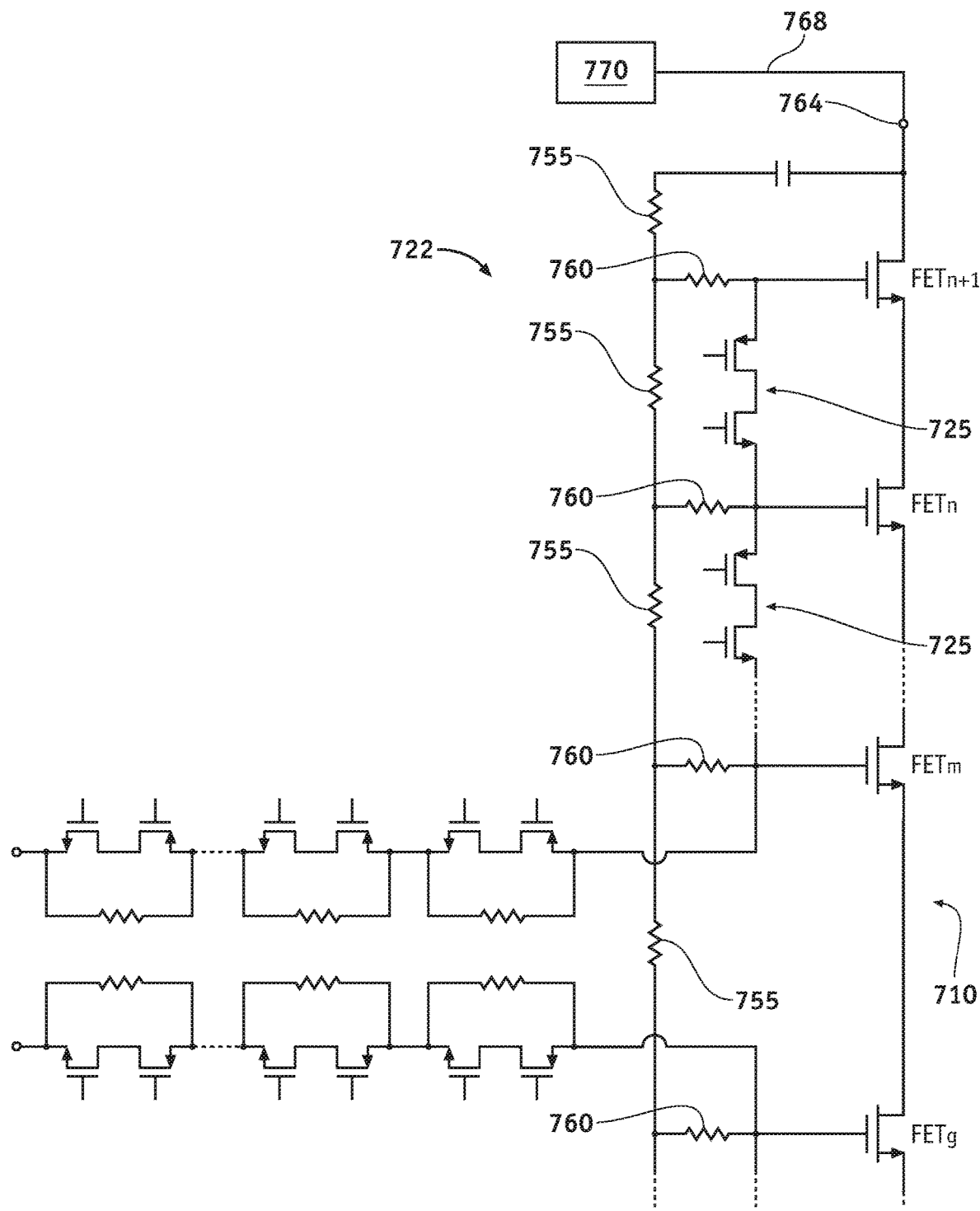

FIG. 7 shows an embodiment similar to FIG. 6, where the gate resistor ladder (722) has both rail resistors (755) and rung resistors (760). In this embodiment all rung resistors (760) and a subset of rail resistors (755) may be selectively bypassed using ladder resistor bypass switches (725). The FET switch stack (710) comprises a stacked arrangement of FET switches (FETn, FETn+1, etc.) connected at one end to an RF terminal (764) coupled to a signal source (770) providing an RF signal (768).

Figure 8:
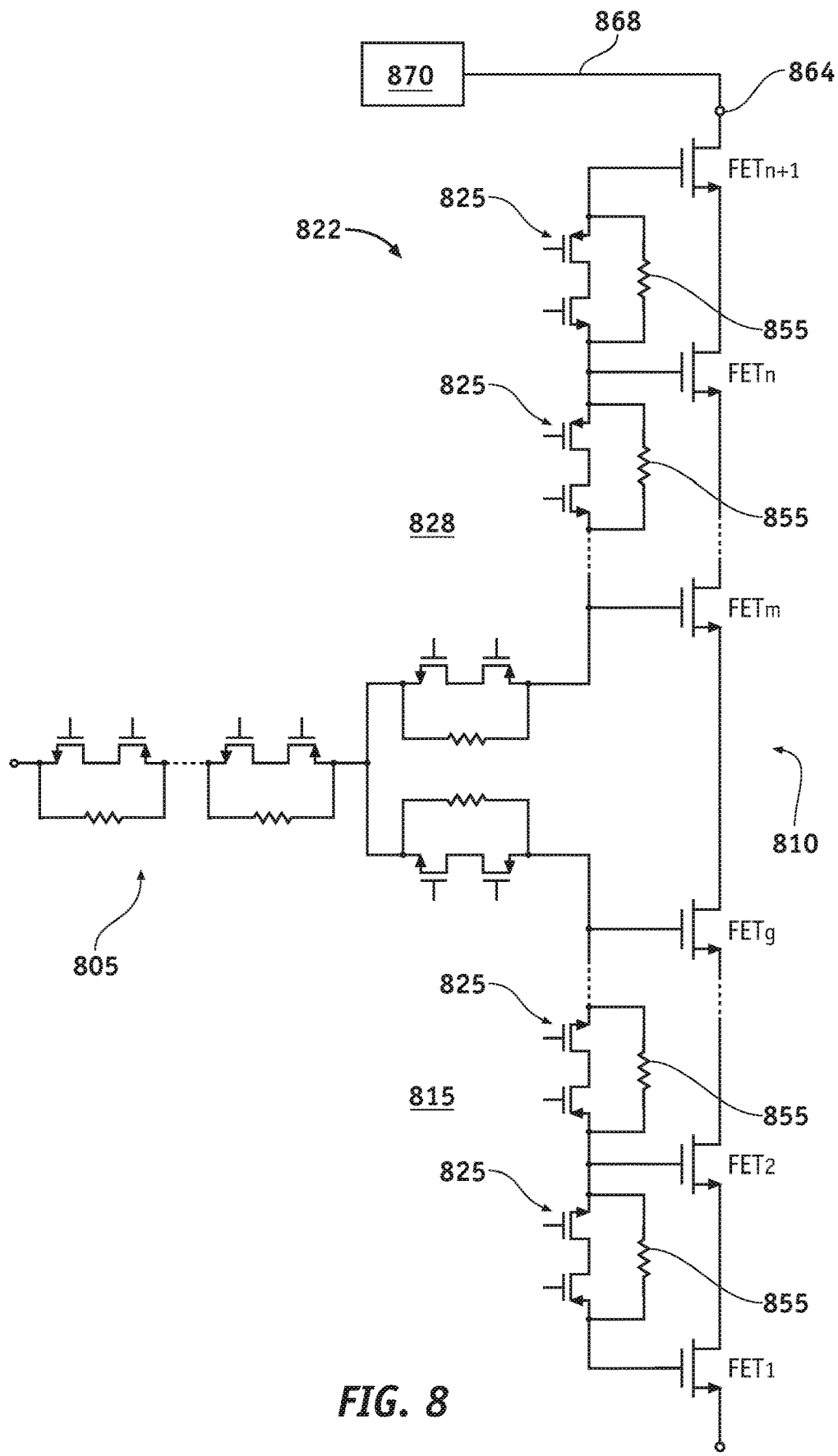
FIGS. 8 and 9 show embodiments of the disclosure where a single bypass feed is branched into two feeds on the ladder side.

FIG. 8 shows yet another embodiment where a single bypass feed (805) on the common side is branched into two feeds (815, 828) on the ladder side, the gate resistor ladder network (822) having rail resistors (855) only, all of which may be selectively bypassed using ladder resistor bypass switches (825). The FET switch stack (810) comprises a stacked arrangement of FET switches (e.g., FETn and FETn+1) connected at one end to an RF terminal (864) coupled to a signal source (870) providing an RF signal (868).

Figure 9:
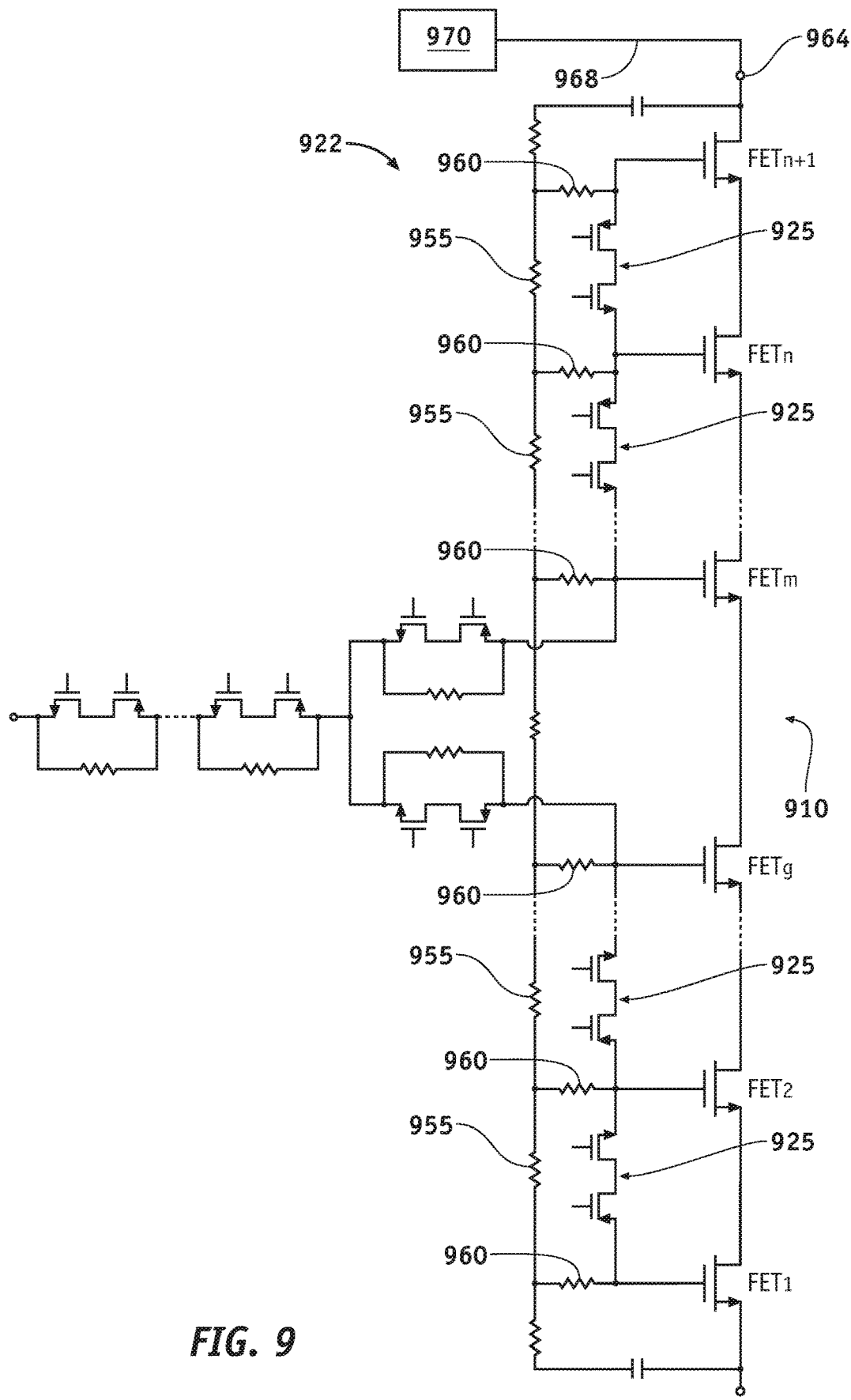

FIG. 9 shows an embodiment similar to FIG. 8, where the gate resistor ladder (922) has both rail resistors (955) and rung resistors (960), all of which may be selectively bypassed using ladder resistor bypass switches (925). The FET switch stack (910) comprises a stacked arrangement of FET switches (e.g., FETn, FETn+1, etc.) connected at one end to an RF terminal (964) coupled to a signal source (970) providing an RF signal (968).

With reference to FIGS. 1-9, features and/or benefits of some embodiments include apparatus capable of selectively bypassing one or more rail resistors and/or one or more rung resistors during some time periods and not bypassing those resistors during other time periods. Those resistors may be referred to as selectively bypassable resistors. In some embodiments, the selectively bypassable resistors are bypassed during transition periods and faster switching times are achieved by the RF switch FET stack. In some embodiments, the selectively bypassable resistors are not bypassed during at least a portion (also called steady state portion throughout the present disclosure) of the ON steady state of the stacked arrangement of FET switches and an insertion loss associated with the RF switch FET stack is reduced. In some embodiments, the selectively bypassable resistors are not bypassed during at least a steady state portion of the OFF steady state of the stacked arrangement of FET switches and a breakdown voltage of the RF switch FET stack is increased.

Figure 10:
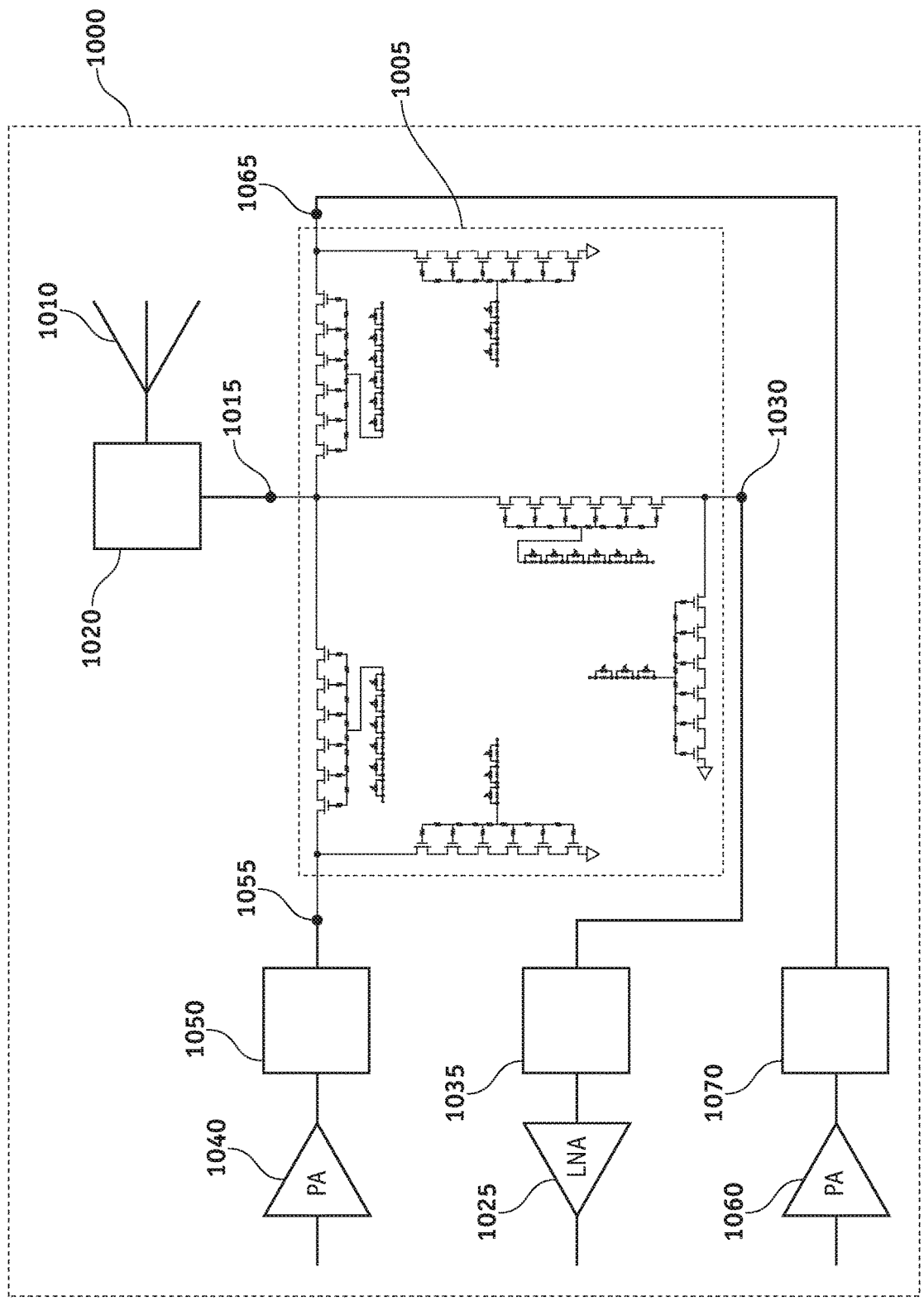
FIG. 10 shows an embodiment of a wireless communication device including an RF switch.

FIG. 10 shows another embodiment of the present disclosure, where a wireless communication device (1000) including an RF switch (1005) is shown.

RF switch (1005) includes one or more FET switch stack pairs, where each pair comprises a first FET switch stack with a plurality of FETs connected in series between a first RF terminal and a second RF terminal, and a second FET switch stack with a plurality of FETs connected in series between the second RF terminal and a ground node. By way of example, RF switch (1005) shows three such switch stack pairs, with respective common RF terminals (1030, 1055 and 1065). Reference can made also to U.S. application Ser. No. 17/492,199 entitled "Methods And Apparatus For Reducing Switching Time Of RF FET Switching Devices" filed on even date herewith and incorporated herein by reference in its entirety One or more of the RF switch stacks of RF switch (1005) comprise a gate resistor bypass arrangement with a first set of bypass switches connected across corresponding common gate resistors and a second set of bypass switches connected across corresponding ladder resistors, in accordance with the teachings of the present disclosure.

Antenna (1010) is connected to RF switch (1005) through antenna terminal (1015). If desired or needed, an intermediate device (1020) (e.g. an antenna matching circuit) can be connected between antenna (1010) and RF switch (1005). FIG. 10 also shows a low noise amplifier (LNA) (1025) connected to one (1030) of the RF terminals of the RF switch (1005). If desired or needed, an intermediate device (1035) (e.g. a filter) can be connected between LNA (1025) and RF switch (1005). FIG. 10 further shows a first power amplifier (PA) (1040) connected to another one (1055) of the RF terminals of the RF switch (1005). If desired or needed, an intermediate device (1050) (e.g. a filter) can be connected between PA (1040) and RF switch (1005). FIG. 10 also shows a second power amplifier (PA) (1060) connected to yet another one (1065) of the RF terminals of the RF switch (1005). If desired or needed, an intermediate device (1070) (e.g. a filter) can be connected between (PA) (1060) and RF switch (1005).

The wireless communication device described in FIG. 10 can be implemented in one of a smartphone, a cellular phone, a personal digital assistant (PDA), a tablet, a wireless-enabled computer, a base station transceiver (BST), a WiFi access point, a WiFi router, and/or a small cell cellular radio access node.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A FET switch stack comprising:
a stacked arrangement of FET switches connected at one end to an RF terminal configured to be coupled to an RF signal, the FET switch stack configured to have an ON steady state where the FET switches are ON, an OFF steady state where the FET switches are OFF, and a transition state where the FET switches are transitioning from ON to OFF or vice versa;
a gate resistor network comprising one or more ladder resistors connected to gate terminals of the FET switches;
one or more common gate resistors connected to the gate resistor network, the gate resistor network and the one or more common gate resistors configured to feed a gate control voltage to the gate terminals of the FET switches;
a gate resistor bypass arrangement comprising a first set of bypass switches connected across corresponding common gate resistors and a second set of bypass switches connected across corresponding ladder resistors; and
wherein:
the ladder resistors comprise rail resistors and rung resistors, and the gate resistor bypassing arrangement is configured to bypass a first portion of the rail resistors and not bypass a remaining portion of the rail resistors.

2. The FET switch stack of claim 1, wherein the gate resistor bypass arrangement is configured to:
   i) bypass the one or more common gate resistors and the one or more ladder resistors during at least a transition portion of the transition state of the stacked arrangement of FET switches, the first set of bypass switches and the second set of bypass switches being in an ON state during said transition portion, and
   ii) not to bypass the one or more common gate resistors and the one or more ladder resistors during at least a steady state portion of the ON steady state and the OFF steady state of the stacked arrangement of FET switches, the first set of bypass switches and the second set of bypass switches being in an OFF state during said steady state portion.

3. The FET switch stack of claim 1, wherein one or more bypass switches in the first set of bypass switches comprise an nMOS transistor and one or more bypass switches in the second set of bypass switches comprise an nMOS transistor.

4. The FET switch stack of claim 1, wherein one or more bypass switches in the first set of bypass switches comprise a pMOS transistor and one or more bypass switches in the second set of bypass switches comprise a pMOS transistor.

5. The FET switch stack of claim 1, wherein each bypass switch in the first set of bypass switches comprises an nMOS and pMOS transistor pair connected in series and each bypass switch in the second set of bypass switches comprises an nMOS and pMOS transistor pair connected in series.

6. The FET switch stack of claim 5, wherein when the first set of bypass switches and the second set of bypass switches are in the OFF state one of the nMOS transistor and the pMOS transistor of each transistor pair is in an OFF state and the other of the nMOS transistor and the pMOS transistor of each transistor pair is in an ON state.

7. The FET switch stack of claim 1, wherein the first set of bypass switches comprises a number of switches that is a function of an internal voltage of the stacked arrangement of FET switches in the ON steady state.

8. The FET switch stack of claim 1, wherein the first set of bypass switches comprises a number of switches that is a function of an internal voltage of the stacked arrangement of FET switches in the OFF steady state.

9. The FET switch stack of claim 1, wherein the first set of bypass switches connected across the one or more common gate resistors are included in a single common gate resistors bypass feed.

10. A receiver switch comprising the FET switch stack of claim 1.

11. A wireless communication device comprising:
   a first FET switch stack comprising a plurality of FETs connected in series between a first RF terminal and a second RF terminal;
   a second FET switch stack comprising a plurality of FETs connected in series between the second RF terminal and a ground node; and
   an antenna connected to the first RF terminal,
   wherein one or more the first and second FET switch stacks comprise the FET switch stack of claim 1.

12. The wireless communication device of claim 11, further comprising:
   a third FET switch stack comprising a plurality of FETs connected in series between the first RF terminal and a third RF terminal;
   a fourth FET switch stack comprising a plurality of FETs connected in series between the third RF terminal and the ground node;
   a fifth FET switch stack comprising a plurality of FETs connected in series between the first RF terminal and a fourth RF terminal;
   a sixth FET switch stack comprising a plurality of FETs connected in series between the fourth RF terminal and the ground node;
   a low noise amplifier (LNA) connected to a selected one of the RF terminals; and
   a power amplifier (PA) connected to another selected one of the RF terminals.

13. The wireless communication device of claim 12, wherein each the first, third, and fifth FET switch stacks comprise:
   a gate resistor network comprising one or more ladder resistors connected to gate terminals of the FET switches;
   one or more common gate resistors connected to the gate resistor network; and
   a gate resistor bypass arrangement comprising a first set of bypass switches connected across corresponding common gate resistors and a second set of bypass switches connected across corresponding ladder resistors.

14. The wireless communication device of claim 12, wherein each the second, fourth, and sixth FET switch stacks comprise:
   a gate resistor network comprising one or more ladder resistors connected to gate terminals of the FET switches;
   one or more common gate resistors connected to the gate resistor network; and
   a gate resistor bypass arrangement comprising a first set of bypass switches connected across corresponding common gate resistors and a second set of bypass switches connected across corresponding ladder resistors.

15. A FET switch stack comprising:
   a stacked arrangement of FET switches connected at one end to an RF terminal configured to be coupled to an RF signal, the FET switch stack configured to have an ON steady state where the FET switches are ON, an OFF steady state where the FET switches are OFF, and a transition state where the FET switches are transitioning from ON to OFF or vice versa;
   a gate resistor network comprising one or more ladder resistors connected to gate terminals of the FET switches;
   one or more common gate resistors connected to the gate resistor network, the gate resistor network and the one or more common gate resistors configured to feed a gate control voltage to the gate terminals of the FET switches; and
   a gate resistor bypass arrangement comprising a first set of bypass switches connected across corresponding common gate resistors and a second set of bypass switches connected across corresponding ladder resistors;
   wherein the first set of bypass switches connected across the one or more common gate resistors are included in two separate common gate resistors bypass feeds, a first subset of the first set of bypass switches being connected with a first subset of the second set of bypass switches, and a second separate subset of the first set of bypass switches being connected with a second separate subset of the second set of bypass switches.

16. The FET switch stack of claim 15, wherein the gate resistor bypassing arrangement is configured to bypass a first portion of the rail resistors and not to bypass a remaining portion of the rail resistors.

* * * * *